(12) United States Patent
Murai (10) Patent No.: US 7,226,151 B2
(45) Date of Patent: Jun. 5, 2007

(54) PIEZOELECTRIC ELEMENT, LIQUID EJECTION HEAD AND PROCESS FOR MANUFACTURING THEM

(75) Inventor: Masami Murai, Nagano-ken (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 10/497,456

(22) PCT Filed: Sep. 17, 2003

(86) PCT No.: PCT/JP03/11844

§ 371 (c)(1),
(2), (4) Date: Oct. 29, 2004

(87) PCT Pub. No.: WO2004/027886

PCT Pub. Date: Apr. 1, 2004

(65) Prior Publication Data

US 2005/0052504 A1  Mar. 10, 2005

(30) Foreign Application Priority Data

Sep. 17, 2002 (JP) .......................... 2002-270664
Sep. 1, 2003 (JP) .......................... 2003-308459

(51) Int. Cl.
B41J 2/045 (2006.01)

(52) U.S. Cl. .......................................... 347/71; 347/68
(58) Field of Classification Search ............ 347/68–72; 310/324, 365

See application file for complete search history.

(56) References Cited

U.S. PATENT DOCUMENTS 6,336,717 B1  1/2002  Shimada et al.

FOREIGN PATENT DOCUMENTS

| EP | 0 963 846 A2 | * 12/1999 |
| EP | 963846 A2 | 12/1999 |
| EP | 976560 A2 | 2/2000 |
| JP | 10-93045 A | 4/1998 |
| JP | 2000-198197 | 7/2000 |
| JP | 2000-211134 A | 8/2000 |
| JP | 2000-326503 A | 11/2000 |

* cited by examiner

Primary Examiner—Stephen Meier
Assistant Examiner—Geoffrey S. Mruk
(74) Attorney, Agent, or Firm—Sughrue Mion, PLLC

(57) ABSTRACT

A piezoelectric element comprises a diaphragm 30, a lower electrode 42d formed in a prescribed pattern on the diaphragm, a piezoelectric film 43 formed on the lower electrode, and upper electrodes 44 formed on the piezoelectric film. A metallic layer 42b electrically disconnected from the upper electrodes and the lower electrode is formed on the diaphragm in the vicinity of the piezoelectric film. The gap between the lower electrode and the metallic layer is no more than 200 μm. In this way, excellent crystallinity of the piezoelectric film can be achieved also in the vicinity of the edges of the lower electrode, thereby making it possible to provide piezoelectric elements and a liquid discharge head that can withstand high voltage and are of better reliability.

7 Claims, 9 Drawing Sheets

1 ; INKJET RECORDING HEAD

PIEZOELECTRIC ELEMENT, LIQUID EJECTION HEAD AND PROCESS FOR MANUFACTURING THEM

FIELD OF THE INVENTION

The present invention relates to a piezoelectric element having an electromechanical conversion function, a liquid discharge head using this piezoelectric element and a method of manufacturing these. In particular, it relates to a piezoelectric element whereby excellent voltage withstanding ability and durability are obtained, a liquid discharge head using this and a method of manufacturing these.

BACKGROUND

A liquid discharge head such as an inkjet recording head employs a piezoelectric element as a drive source for discharge of a liquid droplet such as an ink droplet. Typically, such a piezoelectric element comprises a piezoelectric thin film and an upper electrode and a lower electrode arranged sandwiching this piezoelectric thin film.

In order to arrange the piezoelectric elements with high density and to improve the voltage withstanding ability of the piezoelectric elements, for example Laid-open Japanese Patent Application No. 2000-198197 discloses forming the piezoelectric thin film after patterning of the lower electrode in a prescribed shape.

Sometimes, however, with a conventional piezoelectric element as described above, the crystallinity of the piezoelectric thin film in particular in the vicinity of the edges of the lower electrode is insufficient, so that reliability could not be described as sufficient.

An object of the present invention is to provide a piezoelectric element and liquid discharge head of higher reliability and capable of withstanding high voltage, by securing excellent crystallinity of the piezoelectric film in the vicinity of the edges of the lower electrode.

SUMMARY

In order to solve the above problem, a piezoelectric element according to the present invention comprises a diaphragm, a lower electrode formed with a prescribed pattern on the diaphragm, a piezoelectric film formed on the lower electrode and an upper electrode formed on the piezoelectric film. Also, in the vicinity of the piezoelectric film, there is provided a metallic layer formed on the diaphragm and constituting a metallic layer which is electrically disconnected from the lower electrode. By providing a metallic layer in the vicinity of the region where the piezoelectric film is formed, baking conditions of the piezoelectric film can be made uniform and excellent crystallinity of the piezoelectric film can be achieved, even in the vicinity of the edges of the lower electrode.

In the above piezoelectric element, preferably the metallic layer is formed of the same material as the lower electrode. Also, preferably the gap between the lower electrode and the metallic layer which is electrically disconnected there from is no more than 200 µm.

In the above piezoelectric element, preferably the piezoelectric film is formed so as to at least partially cover the aforesaid metallic layer and an electrode that extends from the upper electrode and is provided for wiring purposes is formed on a portion of the aforesaid metallic layer which is covered by the piezoelectric film, being insulated from the metallic layer by this piezoelectric film.

In the vicinity of the piezoelectric film, there may be further provided a second metallic layer constituting a metallic layer formed on the diaphragm and electrically connected with the electrode for wiring purposes that extends from the upper electrode but electrically disconnected from the lower electrode.

In the piezoelectric element, preferably the piezoelectric film is formed on the lower electrode, which is formed in the prescribed pattern, and on the diaphragm where the lower electrode is not present, and in the portion of the piezoelectric film that is formed on the lower electrode the number of layers of the aforesaid piezoelectric film is larger than in the portion formed on the diaphragm.

A liquid discharge head according to the present invention comprises a piezoelectric element as above, a pressure chamber whose internal volume is changed by mechanical displacement of this piezoelectric element, and a discharge port whereby a liquid droplet is discharged, communicating with this pressure chamber.

A liquid discharge device according to the present invention comprises a liquid discharge head as described above and a drive device that drives this liquid discharge head.

A method of manufacturing a piezoelectric element according to the present invention comprises the step of forming a lower electrode and a metallic layer in the vicinity of the lower electrode on a diaphragm in a prescribed pattern; the step of forming a piezoelectric film on the lower electrode; and the step of forming an upper electrode on the piezoelectric film; the metallic layer being formed so as to be electrically disconnected from the lower electrode.

Another method of manufacturing a piezoelectric element according to the present invention comprises the step of depositing a conductive film on a diaphragm; a first step of depositing a piezoelectric film in which a piezoelectric film is deposited on the conductive film; the step of dividing the conductive film into a lower electrode and a metallic layer that is positioned in the vicinity of the lower electrode and electrically disconnected from this lower electrode, by patterning of the conductive film and the piezoelectric film deposited in the first piezoelectric film deposition step; a second piezoelectric film deposition step of depositing a further piezoelectric film on the piezoelectric film left by the patterning and on the diaphragm where the piezoelectric film was removed; and the step of forming an upper electrode on the piezoelectric film.

A method of manufacturing a liquid discharge head according to the present invention comprises the step of forming a piezoelectric element by the above method; the step of forming a pressure chamber whose internal volume is changed by mechanical displacement of the piezoelectric element; and the step of forming a discharge port whereby a liquid droplet is discharged, communicating with this pressure chamber.

In the drawings, reference symbol 20 indicates a pressure chamber substrate, 30 indicates a diaphragm, 31 indicates an oxide film, 32 indicates a $ZrO_2$ film, 40 indicates a piezoelectric element, 42 indicates a conductive layer, 42a indicates an inside metallic layer, 42b indicates an outside metallic layer, 42d indicates a lower electrode, 43 indicates a piezoelectric thin film and 44 indicates an upper electrode.

DETAILED DESCRIPTION

Preferred embodiments of the present invention are described below with reference to the drawings.

<1. Overall Construction of an Inkjet Printer>

Figure 1:
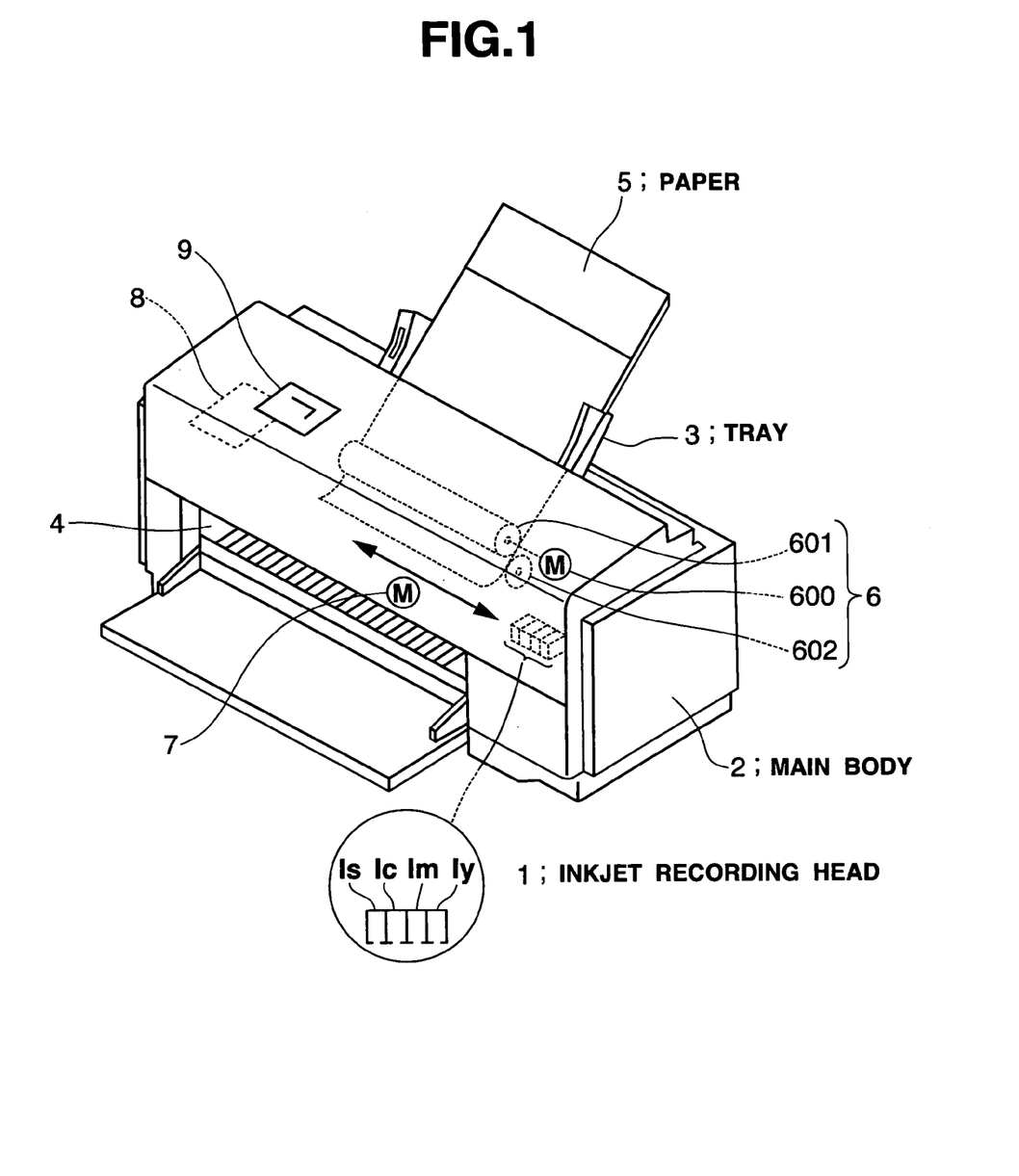
FIG. 1 is a perspective view illustrating the structure of a printer (liquid discharge device) wherein a piezoelectric element according to an embodiment of the present invention is employed.

FIG. 1 is a perspective view showing the construction of a printer constituting a liquid discharge device wherein a piezoelectric element according to an embodiment of the present invention is employed. In this printer, the main body 2 is provided with a tray 3, a discharge port 4 and control buttons 9. In addition, in the interior of the main body 2, there are provided an inkjet recording head 1 constituting a liquid discharge head, a paper feed mechanism 6 and a control circuit 8.

The inkjet recording head 1 comprises a plurality of piezoelectric elements formed on a substrate and is constituted so as to be capable of discharging ink constituting the liquid from a nozzle in response to a discharge signal supplied from the control circuit 8.

The main body 2 constitutes a printer casing, with a paper feed mechanism 6 arranged in a position capable of being supplied with paper 5 from a tray 3 and an inkjet recording head 1 capable of printing onto the paper 5. The tray 3 is constituted so as to be capable of supplying blank paper 5 to the paper feed mechanism 6 and the discharge port 4 constitutes a discharge port whereby paper 5 is discharged after printing.

The paper feed mechanism 6 comprises a motor 600, rollers 601, 602 and other mechanical structures, not shown. The motor 600 is rotatable in response to a drive signal supplied from the control circuit 8. The mechanical structures are constituted so as to be capable of transmitting the rotational force of the motor 600 to the rollers 601 and 602. The rollers 601 and 602 are arranged to be rotated when rotational force of the motor 600 is transmitted thereto, so as to entrain paper 5 placed in the tray 3 by their rotation and to feed this paper so that it can be printed by the head 1.

The control circuit 8 comprises a CPU, ROM and RAM and an interface circuit, not shown, and is arranged to supply drive signals to the paper feed mechanism 6 in response to printing information supplied from the computer through a connector, not shown, or to supply a discharge signal to the inkjet recording head 1. Also, the control circuit 8 is arranged to be capable of performing processing such as setting or resetting of the operating mode in response to control signals from the control panel 9.

The printer of this embodiment is a high-performance printer, being provided with an inkjet recording head having excellent voltage withstanding ability and durability and excellent printing performance as will be described.

<2. Construction of the Inkjet Recording Head>

Figure 2:
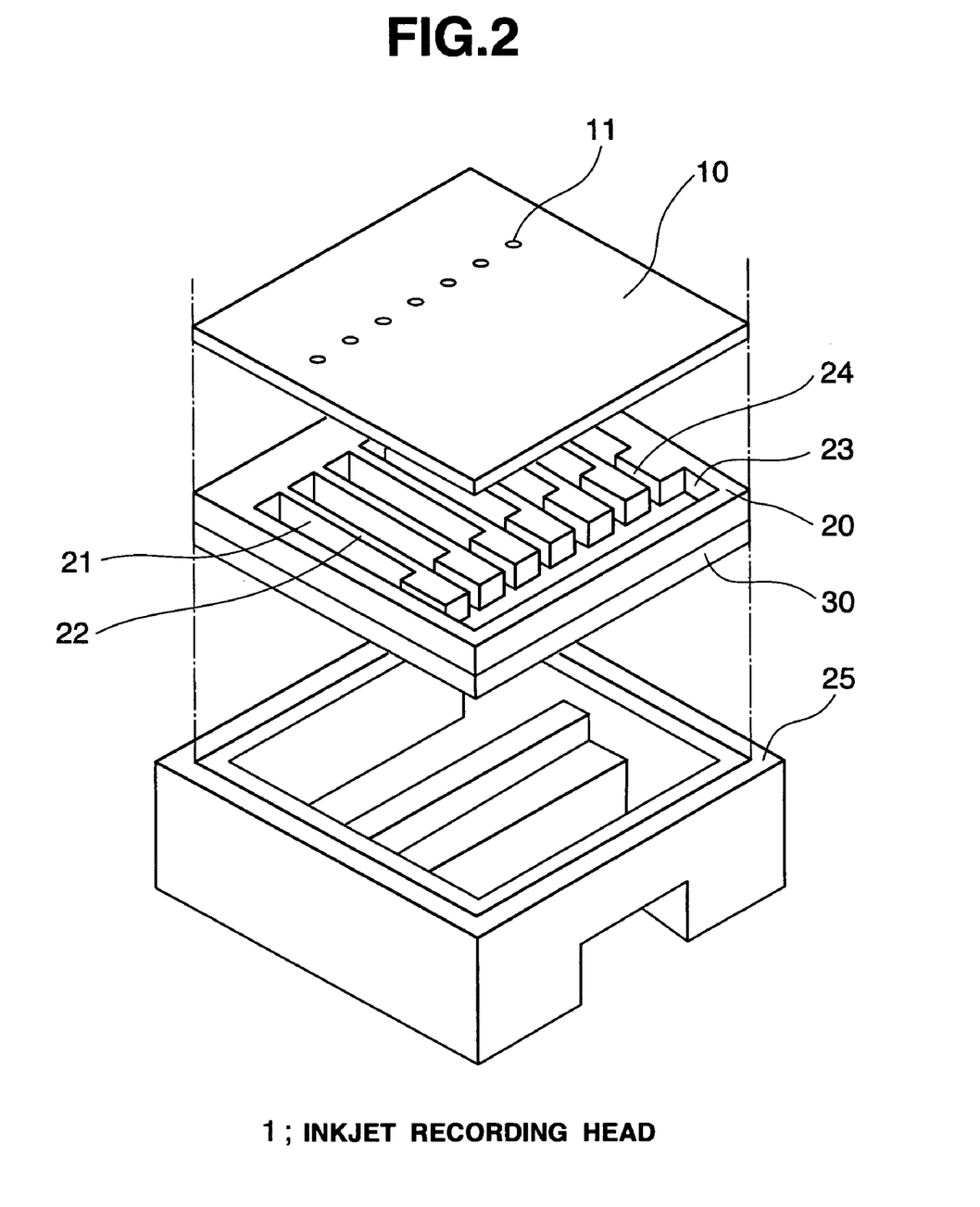
FIG. 2 is an exploded perspective view showing the construction of major parts of an ink jet recording head constituting a liquid discharge head according to an embodiment of the present invention.

FIG. 2 is an exploded perspective view showing the construction of major parts of an inkjet recording head constituting a liquid discharge head according to an embodiment of the present invention.

As shown in FIG. 2, the inkjet recording head comprises a nozzle plate 10, pressure chamber substrate 20 and diaphragm 30.

Figure 3:
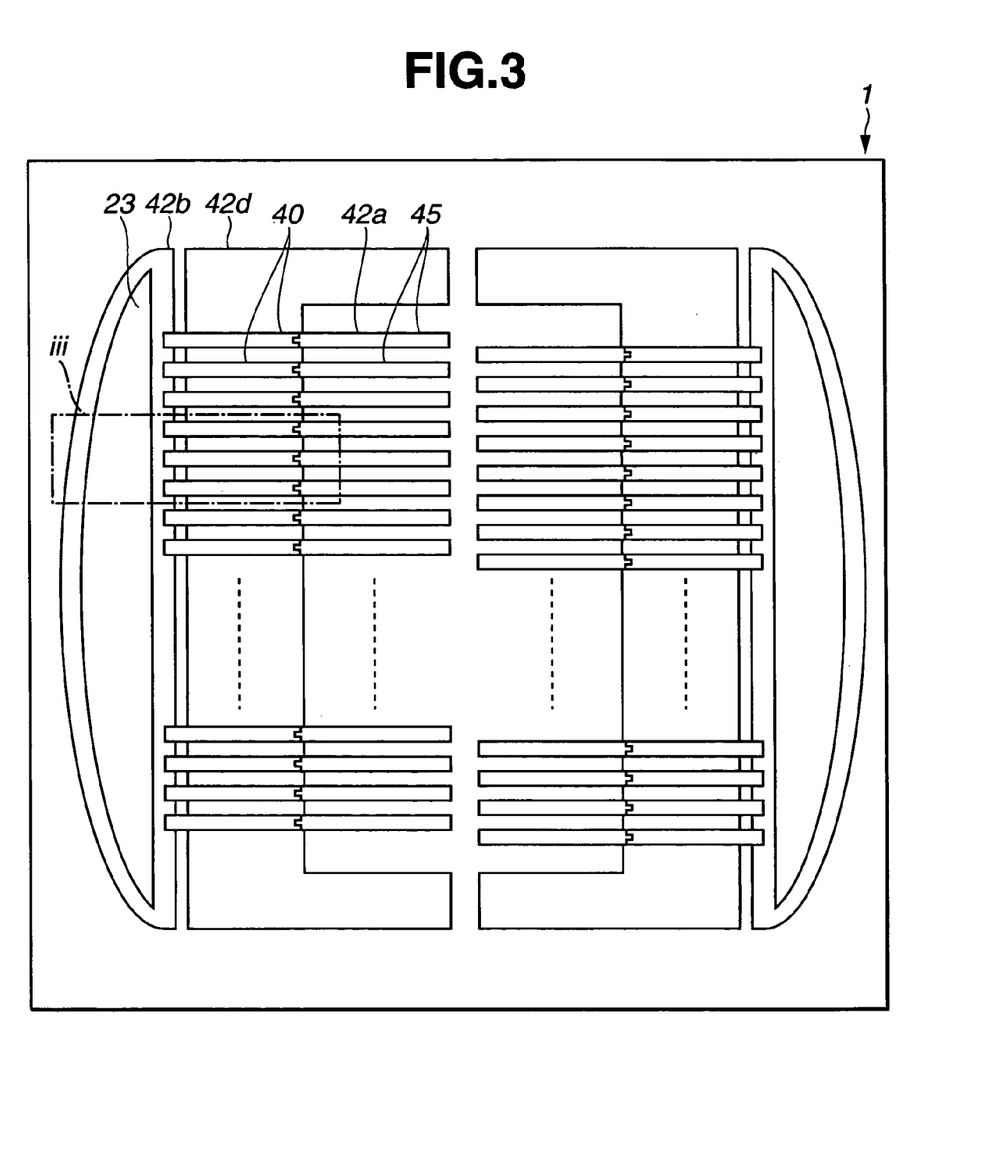
FIG. 3 is a plan view showing details of the arrangement of a piezoelectric element in an inkjet recording head according to a first embodiment.

The pressure chamber substrate 20 comprises pressure chambers (cavities) 21, side walls 22, a reservoir 23 and supply ports 24. The pressure chambers 21 constitutes spaces for accumulating for example ink for discharge and are formed by etching a substrate made for example of silicon. The side walls 22 are formed so as to partition the pressure chambers 21. The reservoir 23 constitutes a common flow path for supply of ink through the supply port 24 to the respective pressure chambers 21. These pressure chambers 21, side walls 22, reservoir 23, and supply port 24 are only shown diagrammatically and a large number of pressure chambers and associated elements may be provided, as shown in FIG. 3, to be described.

The nozzle plate 10 is stuck onto one face of the pressure chamber substrate 20 such that nozzles 11 thereof are arranged in positions respectively corresponding to the pressure chambers 21 provided in the pressure chamber substrate 20.

The diaphragm 30 is formed by laminating an oxide film 31 and $ZrO_2$ film 32, as will be described, and is stuck onto the other face of the pressure chamber substrate 20. The diaphragm 30 is provided with an inkjet connection port, not shown, so as to be capable of supplying ink accumulated in an ink tank, not shown, to the reservoir 23 of the pressure chamber substrate 20.

The inkjet recording head 1 is constituted by a head unit comprising the nozzle plate 10, diaphragm 30 and pressure chamber substrate 20 and is accommodated in the casing 25.

<3. Construction of the Piezoelectric Element>

<3-1. First Embodiment>

FIG. 3 is a plan view showing details of the arrangement of piezoelectric elements in the inkjet recording head of the first embodiment. In this case, a large number of piezoelectric elements 40 are arranged alternately in two rows. For example in the case of 360 dpi (dots per inch), 360 piezoelectric elements 40 are arranged in one inch in the first row and in the second row 360 piezoelectric elements 40 are arranged in positions offset by $\frac{1}{720}$ inch with respect to the first row.

The lower electrodes 42d of the piezoelectric elements 40 are electrodes that are common to each row. An inside metallic layer 42a that is electrically disconnected from the lower electrode 42d and from the upper electrodes 44, to be described, is formed in the vicinity of the inside of the lower electrodes 42d of the two rows. Thus, in the vicinity of the outside of the lower electrodes 42d of the two rows, there is formed an outside metallic layer 42b that is electrically disconnected from the lower electrode 42d and from the upper electrodes 44, to be described. The inside metallic layer 42a and outside metallic layer 42b that are here referred to surround the portions of the lower electrode 42d where piezoelectric elements 40 are not formed and also the piezoelectric elements 40. Narrow strip electrodes 45 for respective wiring extend from the upper electrodes of the piezoelectric elements 40 to the inside of each row, passing above the inside metallic layer 42a without contacting the inside metallic layer 42a.

Figure 4A:
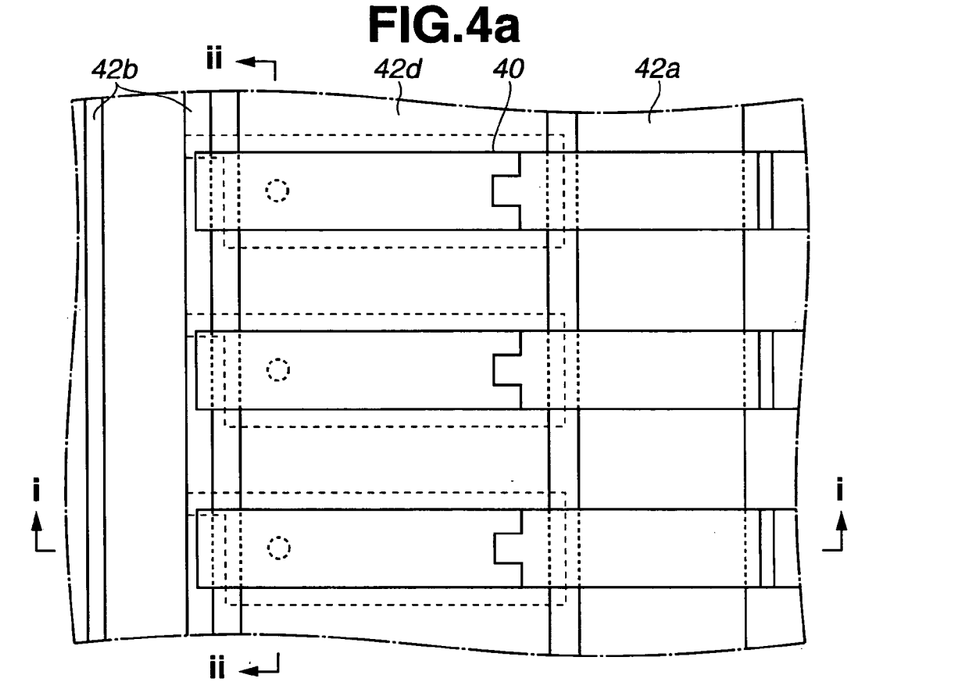
FIG. 4 shows a plan view (a) to a larger scale of the portion enclosed by the line iii in FIG. 3, a cross-sectional view (b) along the line i—i thereof and a cross-sectional view (c) along the line ii—ii.
Figure 4B:
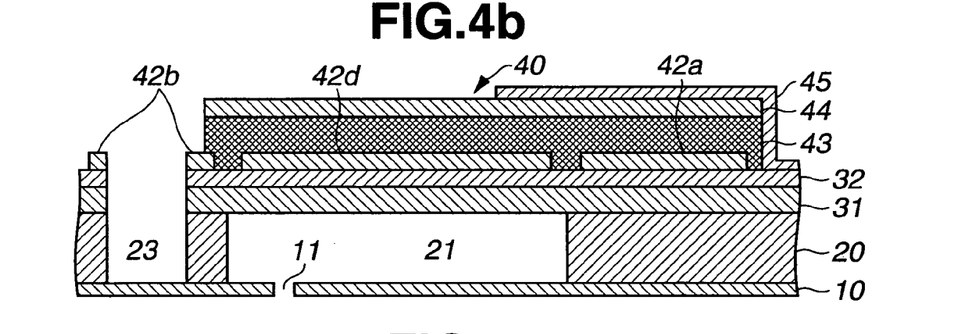
Figure 4C:
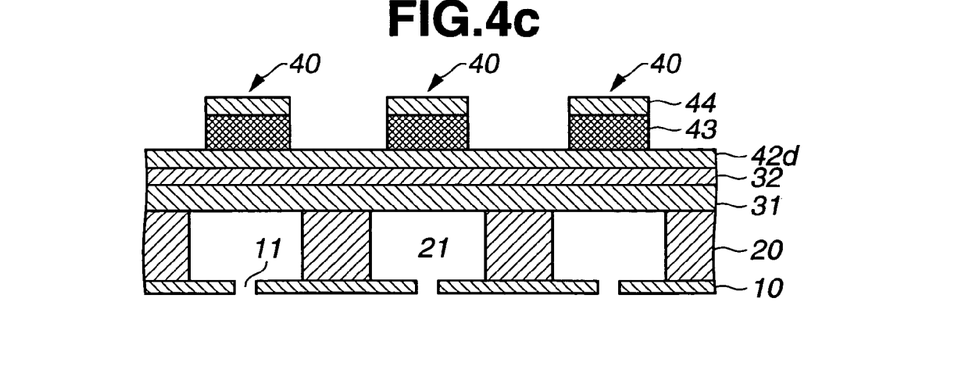

FIG. 4 shows a plan view (a) to a larger scale of the portion enclosed by the line iii in FIG. 3, a cross-sectional view (b) along the line i—i thereof and a cross-sectional view (c) along the line ii—ii.

As shown in FIG. 4, the respective individual discharge sections of the inkjet head 1 are constituted by successively laminating $ZrO_2$ film 32, lower electrode 42d, piezoelectric thin film 43 and upper electrodes 44 on an oxide film 31.

The oxide film 31 is formed as an insulating film on the pressure chamber substrate 20 made of monocrystalline silicon of for example thickness 100 μm. Preferably, a film made of silicon oxide ($SiO_2$) may be formed in a thickness of 1.0 μm.

The $ZrO_2$ film 32 is a layer providing resilience and is used, integrated with the oxide film 31, to constitute the diaphragm 30. Since this $ZrO_2$ film 32 provides the function of conferring resilience, it preferably has a thickness of at least 200 nm and less than 800 nm.

An adhesion layer (not shown) made of metal, preferably titanium or chromium, may be provided between the $ZrO_2$ film 32 and the lower electrode 42d so as to stick these two layers together. The adhesion layer is a layer formed to improve adhesion to the surface where the piezoelectric elements are arranged and need not be formed if such adhesion can be guaranteed. Also, if such an adhesion layer is provided, it is preferably of a thickness of at least 10 nm.

The lower electrode 42d is in this case of a layered construction of layers containing at least Ir, for example, from the lowest layer, a layer containing Ir, a layer containing Pt, and a layer containing Ir. The overall thickness of the lower electrode 42d may be for example 200 nm.

The layered construction of the lower electrode 42d is not restricted to this and could be a double-layered construction of a layer containing Ir and a layer containing Pt or a layer containing Pt and a layer containing Ir. It could also be constituted solely by a layer containing Ir.

The piezoelectric thin film 43 consists of a ferroelectric body constituted by crystals of piezoelectric ceramics and is preferably a ferroelectric piezoelectric material such as lead zirconate titanate (PZT) or a material obtained by adding a metallic oxide such as niobium oxide, nickel oxide or magnesium oxide thereto. The composition of the piezoelectric thin film 43 is suitably selected taking into account for example the performance and application of the piezoelectric element. Specifically, for example lead titanate ($PbTiO_3$), lead zirconate titanate ($Pb(Zr,Ti)O_3$), lead zirconate ($PbZrO_3$), lead lanthanum titanate (($Pb$, $La$)$TiO_3$), lead lanthanum zirconate titanate (($Pb$, $La$) ($Zr,Ti)O_3$) or lead zirconate titanate magnesium niobate ($Pb$ ($Zr$, $Ti$) ($Mg$, $Nb$)$O_3$) may suitably be employed. Also, films of excellent piezoelectric characteristics may be obtained by suitable addition of niobium (Nb) to lead titanate and/or lead zirconate.

The thickness of the piezoelectric thin film 43 is kept sufficiently low that cracks are not produced in the manufacturing step but, on the other hand, must be thick enough to achieve sufficient displacement performance: for example at least 1000 nm but not more than 1500 nm is suitable.

The upper electrodes 44 are electrodes paired with the lower electrode 42d and are preferably constructed of Pt or Ir. The thickness of the upper electrodes 44 is preferably about 50 nm.

The lower electrode 42d is an electrode that is common to the respective piezoelectric elements. In contrast, the inside metallic layer 42a and outside metallic layer 42b are positioned on a layer that is of the same height as the lower electrode 42d, but are isolated from the lower electrode 42d. The separation between these is 200 μm or less, preferably 100 μm or less and even more preferably 50 μm or less. The lower limit of the separation may be a separation such as to produce an electrically non-conductive condition: for example a separation of at least 5 μm is desirable. The piezoelectric thin films 43 of the individual piezoelectric elements 40 extend above the inside metallic layer 42a and conductive narrow strip electrodes 45 for wiring purposes are formed thereon on the upper electrodes 44. Consequently, in this first embodiment, the narrow strip electrodes 45 are insulated from the inside metallic layer 42a by the piezoelectric thin films 43. Preferably the inside metallic layer 42a is formed of the same material as the lower electrode 42d. Even if the inside metallic layer 42a is not formed of the same material, it should preferably have an infra-red absorptivity approximating to the material of the lower electrode 42d.

The outside metallic layer 42b is also positioned on a layer of the same height as the lower electrode 42d, but is isolated from the lower electrode 42d and the inside metallic layer 42a. The separation thereof is 200 μm or less, preferably 100 μm or less and even more preferably 50 μm or less. The lower limit of the separation may be a separation such as to produce an electrically non-conductive condition: for example a separation of at least 5 μm is desirable. The outside metallic layer 42b is isolated from the narrow strip electrodes 45 and the upper electrodes 44. Also, although the piezoelectric thin film 43 is formed partially on the outside metallic layer 42b, the upper electrodes 44 and the outside metallic layer 42b are in non-contacting condition. Preferably the outside metallic layer 42b is formed of the same material as the lower electrode 42d. Even if the outside metallic layer 42b is not formed of the same material, it should preferably have an infra-red absorptivity approximating to the material of the lower electrode 42d.

Also, a reservoir 23 for supplying liquid to the pressure chambers 21 is provided in a position closer to the outside metallic layer 42b than the piezoelectric elements 40.

<3-2. Second Embodiment>

Figure 5:
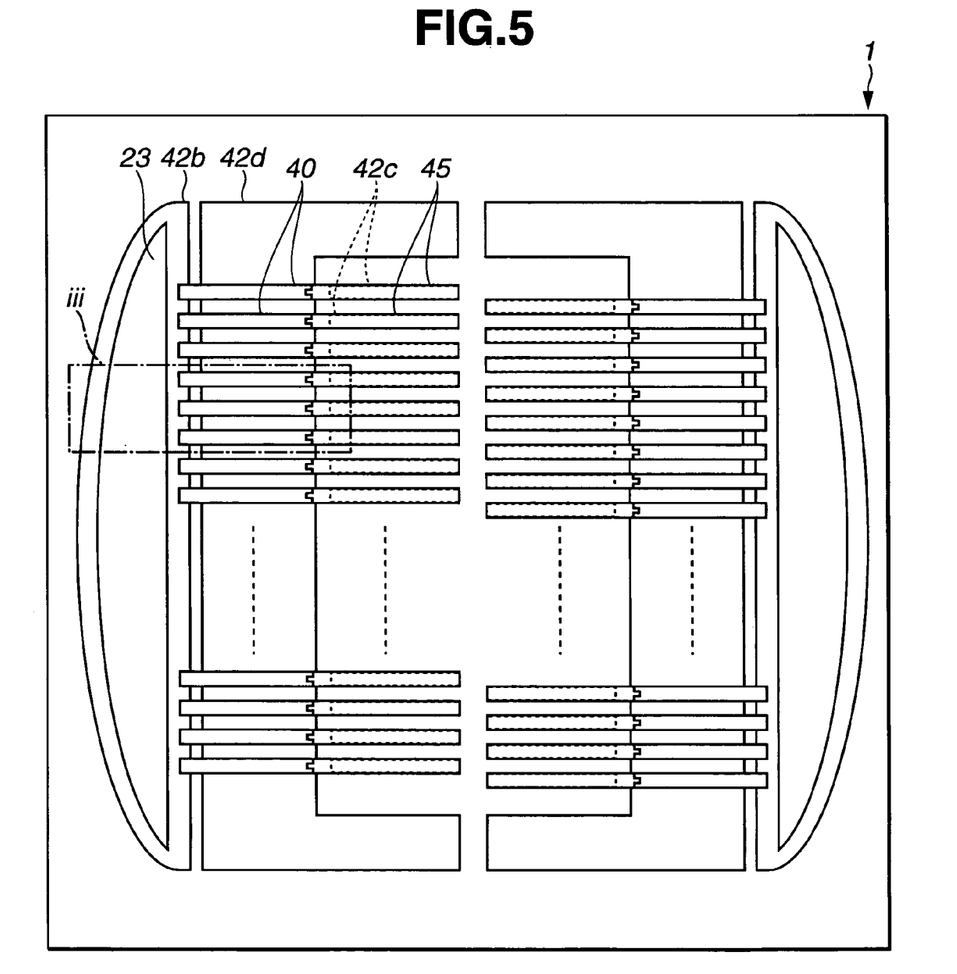
FIG. 5 is a plan view showing details of the arrangement of piezoelectric element in an inkjet recording head according to a second embodiment.

FIG. 5 is a plan view showing details of the arrangement of piezoelectric elements in an inkjet recording head according to a second embodiment. Parts having the same function as in the first embodiment are given the same reference symbols. In the second embodiment, in contrast to the first embodiment, the second metallic layer constituted by an inside metallic layer 42c is divided into segments corresponding to the piezoelectric elements 40. Narrow strip electrodes 45 are formed directly above the respective segments of the inside metallic layer 42c, so the inside metallic layer 42c cannot be seen in plan view in FIG. 5.

Figure 6A:
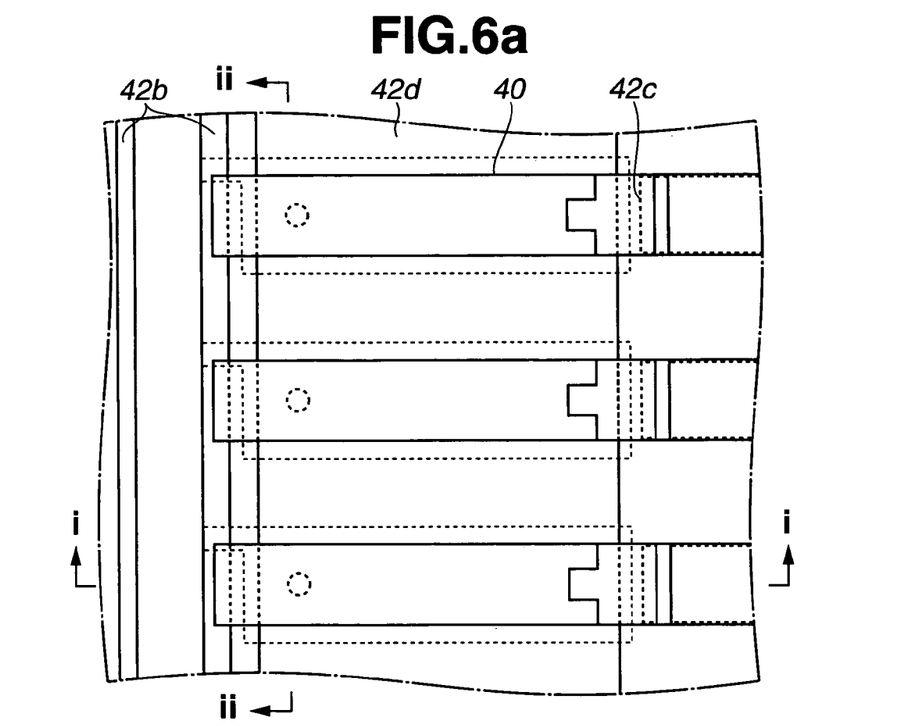
FIG. 6 shows a plan view (a) to a larger scale of the portion enclosed by the line iii in FIG. 5, a cross-sectional view (b) along the line i—i thereof and a cross-sectional view (c) along the line ii—ii.
Figure 6B:
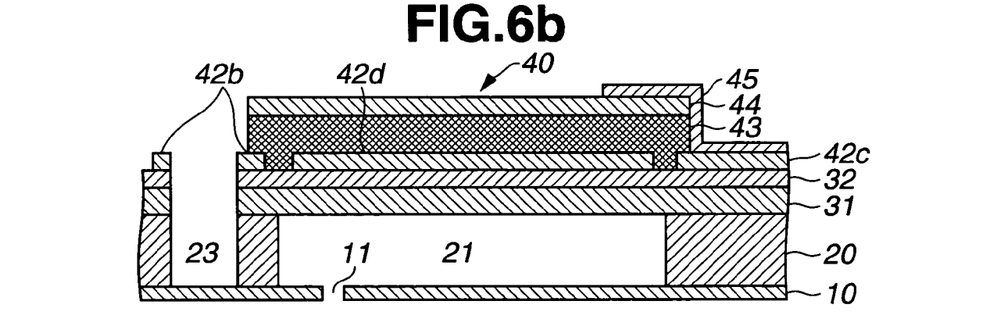
Figure 6C:
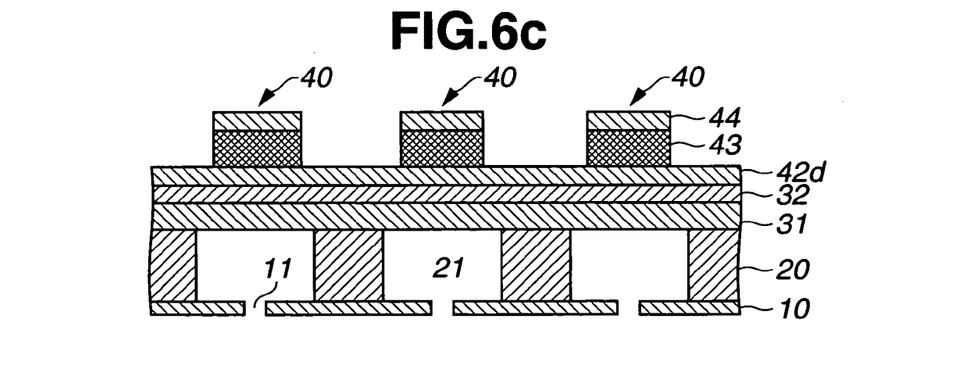

FIG. 6 shows a plan view (a) to a larger scale of the portion enclosed by the line iii in FIG. 5, a cross-sectional view (b) along the line i—i thereof and a cross-sectional view (c) along the line ii—ii. As shown in FIG. 6(b), the piezoelectric film 43 does not completely cover the inside metallic layer 42c. The narrow strip electrodes 45 for wiring that are electrically connected with the upper electrodes 44 are capable of connection with the inside metallic layer 42c.

The inside metallic layer 42c is not connected with the lower electrode 42d, and adjacent segments of the inside electrode layer 42c are not connected, so even if connection occurs with the narrow strip electrodes 45, this causes no electrical problems.

<4. Operation of the Inkjet Recording Head>

The printing operation with the above construction of the inkjet recording head 1 will now be described. When a drive signal is output from the control circuit 8, the paper feed mechanism 6 is actuated, causing blank paper 5 to be fed to a position in which it can be printed by the head 1. If no discharge signal is supplied from the control circuit 8, so that no drive voltage is applied between the lower electrode 42d and upper electrode 44 of a piezoelectric element, no deformation of the piezoelectric film 43 is produced. Thus no pressure change is produced in a pressure chamber 21 if the piezoelectric element with which it is provided is not supplied with a discharge signal and no ink droplet is therefore discharged from the nozzle 11 thereof.

However, if a discharge signal is supplied from the control circuit 8 to a piezoelectric element, causing a certain drive voltage to be applied between the lower electrode 42d and upper electrode 44 of this piezoelectric element, deformation is produced in the piezoelectric film 43 thereof. Considerable flexure of the diaphragm 30 in the pressure chamber 21 where the piezoelectric element that was supplied with this discharge signal is provided is thereby produced. As a result, the pressure in the pressure chamber 21 is instantaneously raised, causing an ink droplet to be discharged from the nozzle 11. By supplying discharge signals individually to the piezoelectric elements in the head in positions corresponding to image data, any desired character or Figure can be printed.

<5. Method of Manufacture>

Figure 7:
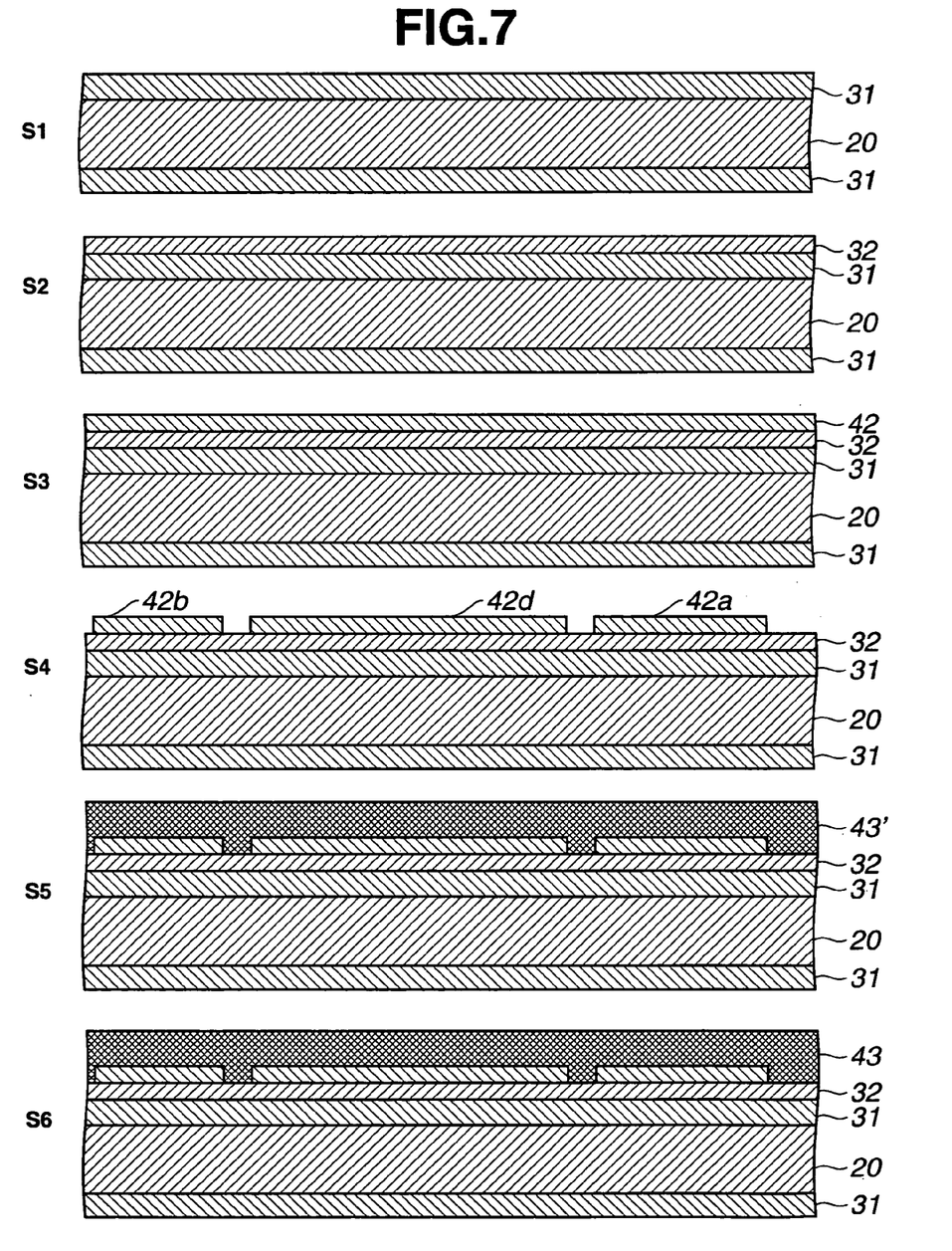
FIG. 7 is a schematic cross-sectional view showing a method of manufacturing the above inkjet recording head.
Figure 8:
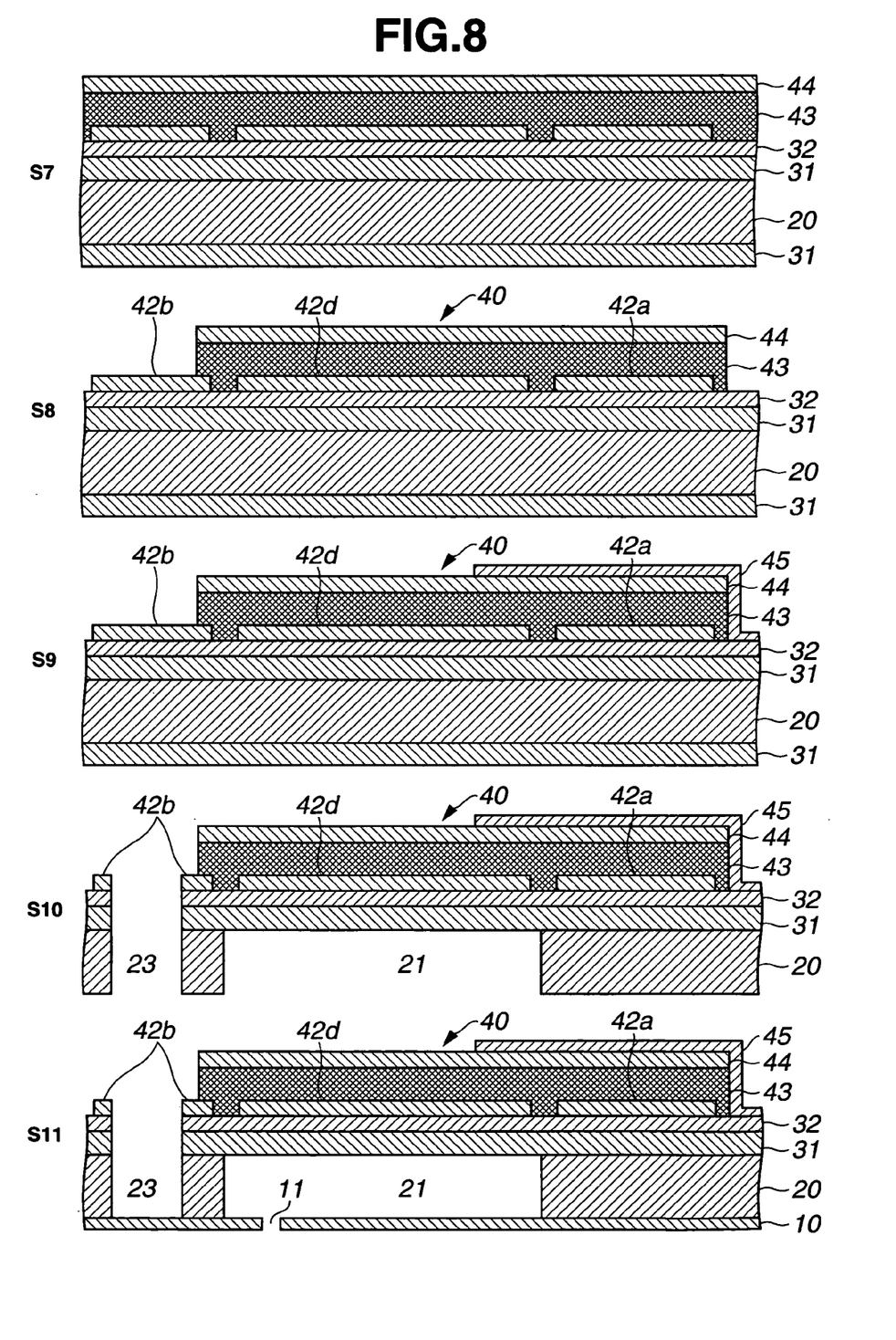
FIG. 8 is a schematic cross-sectional view showing a method of manufacturing the above inkjet recording head.

Next, a method of manufacturing a piezoelectric element according to the present invention will be described. FIG. 7 and FIG. 8 are cross-sectional diagrams showing this piezoelectric element and a method of manufacturing an inkjet recording head. The description with reference to FIG. 7 and FIG. 8 follows the construction of the inkjet recording head of the first embodiment described with reference to FIG. 3 and FIG. 4 above; however, an inkjet recording head according to the second embodiment described in FIG. 5 and FIG. 6 can also be manufactured by the same procedure as this.

Step of Forming an Oxide Film (S1)

This step is a step in which an oxide film 31 made of silicon oxide ($SiO_2$) is formed by high-temperature treatment of the silicon substrate constituting the pressure chamber substrate 20 in an oxidizing atmosphere containing oxygen or water vapor. For this step, apart from the normally employed thermal oxidation method, a CVD method could also be employed.

Step of Forming a $ZrO_2$ Film (S2)

This step is a step of forming a $ZrO_2$ film 32 on the oxide film 31 formed on one face of the pressure chamber substrate 20. This $ZrO_2$ film 32 is obtained by high-temperature processing in an oxidizing atmosphere after forming a Zr layer by for example a sputtering method or vacuum evaporation method.

Step of Forming a Conductive Film (S3)

A conductive film 42 containing Ir and constituting the lower electrode is formed on the $ZrO_2$ film 32. For example, first of all, a layer containing Ir is formed, then a layer containing Pt is formed and, in addition, a further layer containing Ir is formed.

The layers constituting the conductive film 42 are formed by depositing using for example the sputtering method, respectively Ir or Pt on the $ZrO_2$ film 32. Prior to forming the conductive film 42, an adhesion layer (not shown) made of titanium or chromium may be formed by the sputtering method or vacuum evaporation method.

Step of Patterning After Formation of the Conductive Film (S4)

After formation of the conductive film, patterning is performed by first of all masking the conductive film 42 to the desired shape and then etching the periphery thereof, in order to divide this conductive film into an inside metallic layer 42a and outside metallic layer 42b and lower electrode 42d. Specifically, first of all, resist material of uniform thickness is applied (not shown) onto the conductive layer 42 by a method such as the spinner method or spray method; next, a mask is formed to the shape of the piezoelectric elements and exposure and development are performed to form a resist pattern on the conductive film (not shown). Part of the conductive film is removed by etching using for example the ion milling or dry etching method which are normally employed and the $ZrO_2$ film 32 is exposed, to form an inside metallic layer 42a, outside metallic layer 42b and lower electrode 42d.

In addition, in order to remove for example contaminating substances or oxidized portions deposited on the surface of the lower electrode in the patterning step, cleaning by reverse sputtering is performed (not shown).

Step of Forming Ti Nuclei (Layer)

This step is a step in which Ti nuclei (layer) (not shown) are formed on the lower electrode 42d by for example the sputtering method. The reason for forming the Ti nuclei (layer) is that crystal growth then takes place from the side of the lower electrode, enabling fine pillar-shaped crystals to be obtained by growing PZT using the Ti crystals as nuclei.

Also, the mean thickness of the Ti nuclei (layer) is 3 to 7 nm, preferably 4 to 6 nm.

Step of Forming a Piezoelectric Precursor Film (S5)

This step is a step of forming a piezoelectric precursor film 43' by the sol gel method.

First of all, a sol made of a solution of organic metallic alkoxide is applied onto the Ti nuclei by a method of application such as for example spin coating. Next, drying is performed for a fixed period at a fixed temperature to evaporate the solvent. After drying, in addition, degreasing is performed for a fixed time at a prescribed high temperature under ordinary atmosphere, to pyrolyse organic ligands that are coordinated with the metal and create metallic oxide. A piezoelectric precursor film consisting of two layers is laminated by repeating a prescribed number of times, for example twice, these steps of application, drying and degreasing. By means of this drying and degreasing treatment, the metallic alkoxide and acetate in the solution form a network of metal, oxygen, metal after pyrolysis of the ligands.

It should be noted that this step is not restricted to the sol gel method but could also be performed by the MOD (metal organic deposition) method.

Baking Step (S6)

This is a step of crystallizing a piezoelectric thin film by baking after formation of the piezoelectric precursor film 43'. By means of this baking, the piezoelectric thin film 43' is made to change from an amorphous condition to a rhombohedral crystalline structure, changing to a thin film showing an electromechanical conversion effect, thereby becoming a piezoelectric thin film 43.

Since the $ZrO_2$ film 32 has a lower absorptivity for near infra-red rays than the lower electrode 42d, the rise in temperature during baking is slowed in regions where the lower electrode 42d is not formed. However, in this embodiment, as shown in FIG. 3 and FIG. 5, the regions where the piezoelectric film is formed are surrounded by the lower electrode 42d, inside metallic layer 42a and outside metallic layer 42b, so a sufficient temperature rise can still be ensured even in the regions where the lower electrode 42d is not formed. As a result, uniform baking conditions of the piezoelectric thin film are achieved. Thus crystallinity of the piezoelectric thin film in particular in the vicinity of the edges of the lower electrode 42d is improved, improving voltage withstanding ability and durability. Also, since the baking conditions can be made uniform in the entire wafer, uniform voltage characteristics among the piezoelectric elements can be achieved.

A piezoelectric thin film 43 of the desired thickness can be produced by repeating the above formation of a precursor film (S5) and baking thereof (S6) a plurality of times. If for example the film thickness of the precursor film applied for a single baking is taken as 200 nm, this would be repeated six times.

Step of Forming the Upper Electrodes (S7)

Upper electrodes 44 are formed on the piezoelectric thin film 43 by an electron beam evaporation method or sputtering method.

Step of Patterning the Piezoelectric Thin Film and Upper Electrodes (S8)

This is a step of patterning the piezoelectric thin film 43 and upper electrodes 44 to the prescribed shape of the piezoelectric elements. Specifically, after spin coating resist onto the upper electrodes 44, patterning is performed by exposure and development matching the positions where the pressure chambers are to be formed. Etching of the upper electrodes 44 and the piezoelectric thin film 43 by for example ion milling is performed, using the remaining resist as a mask. The piezoelectric elements 40 are formed in the above step.

Step of Forming Narrow Strip Electrodes (S9)

Next, narrow strip electrodes 45 are formed connected with the upper electrodes 44. The narrow strip electrodes 45 are preferably made of gold, which is a material of low rigidity and low electrical resistance. Apart from this, for example aluminum or copper are suitable. The narrow strip electrodes 45 are produced by depositing a film of thickness about 0.5 μm, followed by patterning to produce wiring effecting connection with the upper electrodes.

Step of Forming the Pressure Chambers (S10)

Next, the pressure chambers 21, reservoir 23 and supply port 24 are formed by performing anisotropic etching on the other face of the pressure chamber substrate 20 that is formed with the piezoelectric elements 40, or anisotropic etching using a reactive gas such as in parallel plate type reactive ion etching. The portions that are left behind without being etched constitute the side walls 22. The reservoir 23 is formed in a shape rather smaller than the outside metallic layer 42b in a position facing the outside metallic layer 42b and is formed with through-holes using for example a laser.

Step of Sticking on a Nozzle Plate (S11)

Finally, after the pressure chamber substrate 20 has been etched, a nozzle plate 10 is stuck on using adhesive. When sticking on, positional alignment is effected such that the nozzles 11 are arranged at the spaces of the respective pressure chambers 21. After the nozzle plate 10 has been stuck on, the pressure chamber substrate 20 is mounted in a casing, not shown, thereby completing the inkjet recording head 1.

<6. Modified Example of the Method of Manufacture>

Figure 9:
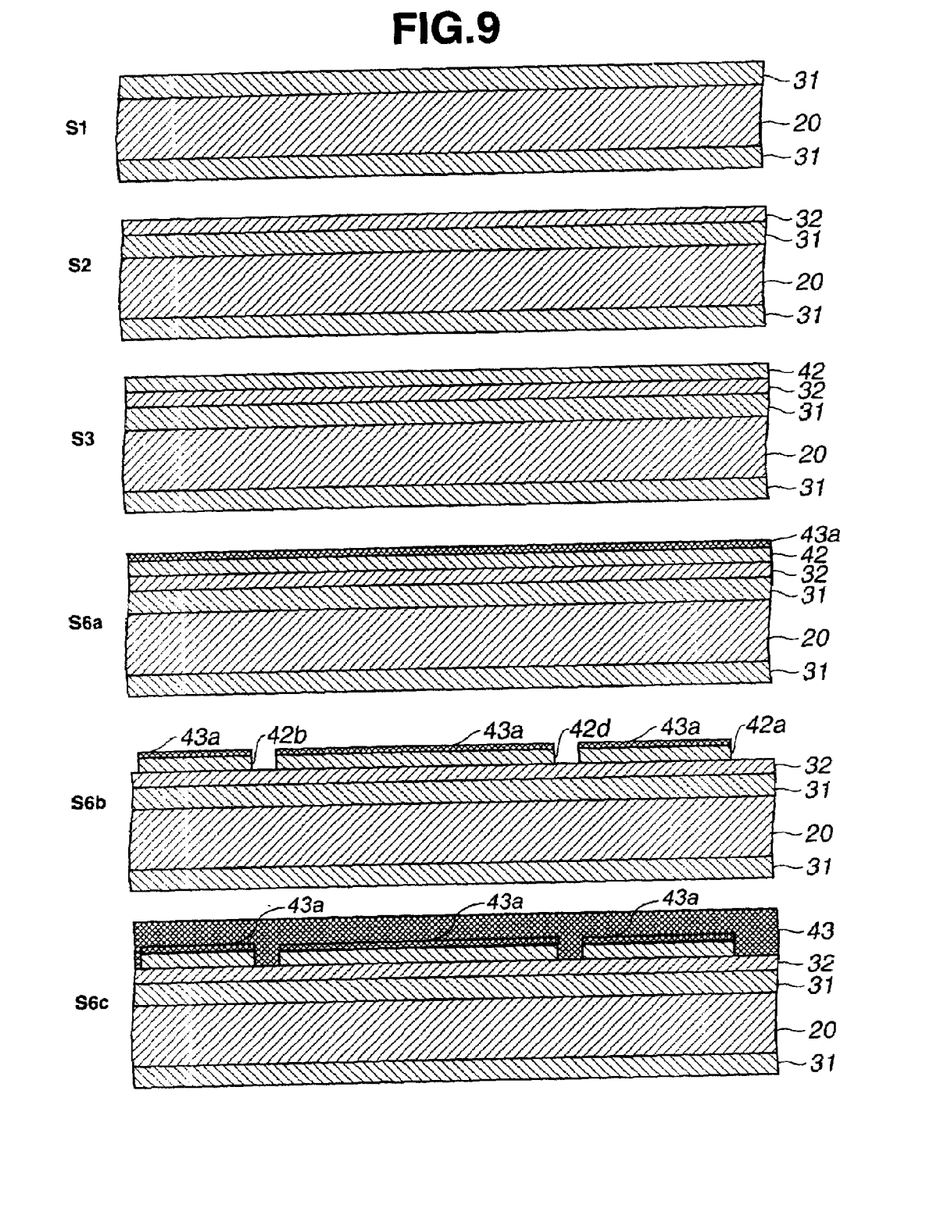
FIG. 9 is a schematic cross-sectional view showing a modified example of the above method of manufacture, showing the step corresponding to FIG. 7.

FIG. 9 is a cross-sectional diagram showing a modified example of the above method of manufacture and shows a step corresponding to FIG. 7. Steps S1 to S3 are the same as in the case of FIG. 7 and the steps after S6c are the same as in the case of FIG. 8, so further description thereof will be dispensed with. In this example, after a conductive film 42 has been formed in S3, a first layer 43a of piezoelectric thin film is formed (S6a) prior to patterning and thereafter patterning is performed (S6b) combining the first layer 43a of piezoelectric thin film and the conductive layer 42.

Step of Forming a First Layer of Piezoelectric Thin Film (S6a)

After a thin film 42 has been formed in S3, a first layer 43a of piezoelectric thin film is formed on the conductive film 42. The method of forming consists in for example forming Ti nuclei (layer) in a thickness of 3 to 7 nm, preferably 4 to 6 nm, and then, as described in S5 and S6 of FIG. 7 above, repeating the steps of sol application, drying and degreasing twice, followed by baking, to form a first layer 43a of piezoelectric thin film of about 200 nm.

Patterning Step (S6b)

Next, the first layer 43a of the piezoelectric thin film and the conductive film 42 are patterned to the same shape as in S4 of FIG. 7. The conductive film 42a is separated into the lower electrode 42d, inside metallic layer 42a and outside metallic layer 42b. The $ZrO_2$ film 32 is exposed in the portions where the first layer 43a of piezoelectric thin film and the conductive film 42 are removed.

Step of Forming Second and Subsequent Layers of Piezoelectric Thin Film (S6c)

Next, after forming Ti nuclei (layer) on the first layer 43a of piezoelectric thin film and $ZrO_2$ film 32 exposed as described above in a thickness of at least 1 nm but no more than 4 nm, second and subsequent layers of piezoelectric thin film are formed by the same method as the first layer described above. The steps of application, drying and degreasing and the step of baking are repeated until a prescribed thickness is achieved. As a result, a piezoelectric thin film 43 of more layers than on the above exposed $ZrO_2$ film 32 is formed on the lower electrode 42d. For example, a piezoelectric thin film 43 of six layers may be formed on the lower electrode 42d and a piezoelectric thin film of 43 of five layers may be formed on the exposed $ZrO_2$ film 32.

The subsequent steps such as formation of the upper electrodes are the same as in step S7 and following steps of FIG. 8.

During baking of the piezoelectric film, change of composition (oxidation and dispersion from the piezoelectric film) of the conductive layer constituting the lower electrode and accompanying increase in film thickness may occur; in particular such changes are liable to occur during baking of the first layer of the piezoelectric film. When baking of the first layer of the piezoelectric film is performed after patterning of the conductive layer, there is also a possibility of generation of imbalance of the film thickness of the conductive layer in the vicinity of the patterning boundaries, with lowering of crystallinity of the piezoelectric film and, in some cases, generation of cracks; however, these can be prevented with the modified example of FIG. 9. That is, since the first layer 43a of piezoelectric thin film is deposited prior to patterning of the conductive layer 42, changes of composition and film thickness of the conductive layer during baking of the first layer 43a of the piezoelectric thin film occur uniformly in the film surface direction. Consequently, stable crystallinity of the piezoelectric thin film is preserved and occurrence of cracking in the piezoelectric thin film can be prevented.

Since changes of composition and film thickness of the conductive film occur during baking of the first layer 43a of the piezoelectric thin film, the changes of composition and film thickness of the lower electrode 42d in baking of the second and subsequent layers of the piezoelectric thin film are small. Excellent crystallinity like that of the first layer of dielectric thin film can therefore be obtained. In particular, even after patterning of the lower electrode constituted by the conductive layer, the regions of formation of the piezoelectric thin film are surrounded by the lower electrode 42d, inside metallic layer 42a and outside metallic layer 42b, so the baking condition of the piezoelectric thin film is uniform. Consequently, as described in S6 of FIG. 7, crystallinity of the piezoelectric thin film, in particular of the lower electrode 42d, in the vicinity of the patterning boundaries is further improved, so the voltage withstanding ability and durability are further improved.

<7. Test Results>

The voltage withstanding ability and durability were investigated in respect of an inkjet recording head according to the first embodiment as described in FIG. 3 and FIG. 4, an inkjet recording head manufactured in accordance with the method of a modified example described with reference to FIG. 9 and FIG. 8 (in which the piezoelectric thin film is PZT of film thickness 1.1 µm, and the gap between the lower electrode 42d and inside metallic layer 42a and outside metallic layer 42b is 50 µm), and an inkjet recording head manufactured by a prior art method (in which the piezoelectric thin film is PZT of film thickness 1.1 µm, and the gap between the lower electrode 42d and inside metallic layer 42a and outside metallic layer 42b is 500 µm).

Regarding voltage withstanding ability, whereas, with the conventional ink jet recording head, cracking occurred at 40 to 50 V, giving rise to insulation breakdown (substantially all of the locations where cracking occurred were in the vicinity of the edges of the lower electrode), the inkjet recording head according to the above embodiment had a voltage withstanding ability of 90 to 110 V (the locations where cracking occurred were random, not being concentrated in a specific portion).

Durability was investigated using a drive voltage of 35 V. Whereas the conventional inkjet recording head showed a deterioration of performance after about 1 billion pulses, in the case of the present embodiment, the inkjet recording head was able to withstand drive with at least 40 billion pulses. It was therefore concluded that an inkjet recording head according to this embodiment showed an outstanding improvement in performance.

<8. Other Examples of Application>

The present invention can be applied in various modified ways apart from the embodiments described above. For example, piezoelectric elements manufactured in accordance with the present invention can be applied not merely to the piezoelectric elements of an inkjet recording head as described above but also to the manufacture of non-volatile semiconductor memory devices, thin film capacitors, pyroelectric detectors, sensors, SAW optical waveguides, optical memory devices, spatial light modulators, ferroelectric devices such as frequency doublers for diode lasers, dielectric devices, pyroelectric devices, piezoelectric devices and electro optical devices.

Also, apart from heads that discharge ink employed in inkjet recording devices, a liquid discharge head according to the present invention can be applied to various types of head that spray liquid such as for example heads that discharge liquid containing a pigment employed in the manufacture of color filters for for example liquid-crystal displays, heads that discharge liquid containing electrode material employed in the formation of electrodes such as organic EL displays or FED (face emission displays), or heads that discharge liquid containing bio-organic substances employed in biochip manufacture.

I claim:

1. A piezoelectric element comprising:
   a diaphragm;
   a lower electrode formed with a prescribed pattern on said diaphragm;
   a piezoelectric film formed on said lower electrode; and
   an upper electrode formed on said piezoelectric film;
   wherein, in the vicinity of said piezoelectric film, there is provided a metallic layer formed on said diaphragm and electrically disconnected from said lower electrode,
   wherein said piezoelectric film is formed on the lower electrode, which is formed in said prescribed pattern, and on said diaphragm where the lower electrode is not present, and
   wherein, in a portion of said piezoelectric film that is formed on said lower electrode, a number of layers of said piezoelectric film is larger than in a portion formed on said diaphragm.

2. The piezoelectric element according to claim 1 wherein said metallic layer is formed of the same material as said lower electrode.

3. The piezoelectric element according to claim 1 or claim 2 wherein a gap between said lower electrode and said metallic layer which is electrically disconnected there from is no more than 200 µm.

4. The piezoelectric element according to claim 1 wherein said piezoelectric film is formed so as to at least partially cover said metallic layer and an electrode that extends from said upper electrode and is provided for wiring purposes is formed on a portion of the said metallic layer which is covered by said piezoelectric film, being insulated from said metallic layer by this piezoelectric film.

5. The piezoelectric element according to claim 1 wherein in the vicinity of said piezoelectric film, there is further provided a second metallic layer formed on said diaphragm and electrically connected with the electrode for wiring purposes that extends from said upper electrode but electrically disconnected from said lower electrode.

6. A liquid discharge head comprising a piezoelectric element according to claim 1, a pressure chamber whose internal volume is changed by mechanical displacement of this piezoelectric element, and a discharge port communicating with this pressure chamber for discharging a liquid droplet.

7. A liquid discharge device comprising a liquid discharge head according to claim 6 and a drive device that drives this liquid discharge head.

* * * * *